US006331958B2

(12) United States Patent
Tsukude

(10) Patent No.: US 6,331,958 B2
(45) Date of Patent: Dec. 18, 2001

(54) SEMICONDUCTOR MEMORY DEVICE HAVING DATA PARALLEL/SERIAL CONVERSION FUNCTION AND CAPABLE OF EFFICIENTLY PERFORMING OPERATIONAL TEST

(75) Inventor: Masaki Tsukude, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 1 days.

(21) Appl. No.: 09/725,856

(22) Filed: Nov. 30, 2000

(30) Foreign Application Priority Data

Apr. 10, 2000 (JP) ........................................ 12-107921

(51) Int. Cl.[7] ........................................ G11C 7/00

(52) U.S. Cl. .................... 365/201; 365/219; 365/189.07; 365/189.02

(58) Field of Search .................................... 365/201, 219, 365/189.07, 220, 221, 230.08, 198, 230.03, 189.02, 230.02

(56) References Cited

U.S. PATENT DOCUMENTS 5,668,764 * 9/1997 Surlekar ............................... 365/201

FOREIGN PATENT DOCUMENTS 5-135600 6/1993 (JP) .

* cited by examiner

*Primary Examiner*—David Nelms
*Assistant Examiner*—David Lam
(74) *Attorney, Agent, or Firm*—McDermott, Will & Emery

(57) ABSTRACT

A semiconductor memory device according to the present invention includes a memory core portion, a test mode control circuit for transmitting data output from the memory core portion to an internal node, and a data input/output control circuit for inputting/outputting in series a plurality of pieces of parallel data input/output to each internal node to a data node. The test mode control circuit transmits read data from the memory core portion as it is to the internal node in a normal reading operation, and compresses data output from the memory core portion on the basis of a prescribed unit and transmits the data to the internal node in a test mode. Therefore, the test data compressed for each prescribed unit can be input/output by using a smaller number of data nodes in the test mode than in the normal operation mode.

14 Claims, 13 Drawing Sheets

SEMICONDUCTOR MEMORY DEVICE HAVING DATA PARALLEL/SERIAL CONVERSION FUNCTION AND CAPABLE OF EFFICIENTLY PERFORMING OPERATIONAL TEST

BACKGROUND OF THE INVENTION

1. Field of the Invention

The present invention relates to semiconductor memory devices and more particularly to a semiconductor memory device inputting and outputting high frequency data by using data parallel/serial conversion.

2. Description of the Background Art

It has been necessary in recent years that the data band widths of semiconductor devices be increased to keep pace with the higher operating frequencies of microprocessors. Publicly known techniques increase the data band width by multiplying the data bus width or raising the clock frequency of a synchronous semiconductor memory device. As a technique of inputting and outputting data at high speed, such a synchronous semiconductor memory device has been proposed that inputs and outputs data in synchronization with both rising and falling edges of a clock signal.

However, achievement of a higher data input/output frequency is limited by access time for a DRAM (Dynamic Random Access Memory) as a memory device. In order to solve this problem, an interface technique has been made public which employs parallel/serial conversion of data so as to increase the frequency of a synchronous clock signal for transmitting input/output data to and from an external unit higher than the internal operating frequency of the DRAM.

FIG. 14 is a schematic block diagram showing a configuration of a conventional semiconductor memory device 500 allowing higher speed interfacing by using data parallel/serial conversion.

Referring to FIG. 14, semiconductor memory device 500 includes a clock terminal 5 receiving a clock signal CLK, a control signal node Ncc receiving a control signal for controlling an operation of semiconductor memory device 500, a memory core portion 20, and a data input/output control portion 40.

Semiconductor memory device 500 further includes a control circuit 10 for controlling operations of memory core portion 20 and data input/output control portion 40 according to a control signal RQ received from control signal node Ncc and clock signal CLK received from clock terminal 5.

Memory core portion 20 operates according to an address signal and command control signals generated by control circuit 10. Memory core portion 20 includes a plurality of memory mats MT0 to MTn (n is a natural number). For each of memory mats MT0 to MTn, m pieces of data (m is a natural number) can be read and written in parallel. In FIG. 14, m=8.

Data input/output control portion 40 performs parallel/serial conversion of data from eight pieces of parallel data input/output for each memory mat into one serial data transmitted by each data node Nd0 to Ndn, and vice versa. Data input/output control portion 40 operates according to data I/O control signals generated by control circuit 10. Data nodes Nd0 to Ndn can transmit data to and from other circuit devices and external units.

Data input/output control portion 40 includes data conversion circuits 50-0 to 50-n and input/output buffers 60-0 to 60-n provided corresponding to memory mats MT0 to MTn.

In outputting data, each of data conversion circuits 50-0 to 50-n converts eight pieces of parallel data output from each memory mat to serial data. Output buffers 60-0 to 60-n output the serial data transmitted from data conversion circuits 50-0 to 50-n as data DQ0 to DQn from data nodes Nd0 to Ndn.

For data input/output control portion 40, only an operation concerning outputting (reading) data will be described in detail. With inputting (writing) data, serial input data input from data nodes Nd0 to Ndn are transmitted through input/output buffers 60-0 to 60-n to data conversion circuits 50-0 to 50-n and the serially input data are converted to parallel data by the data conversion circuits, so that the data can be written to corresponding memory mats in parallel.

The command control signal for controlling memory core portion 20 and the data I/O control signal for controlling data input/output control portion 40, both of which are generated by control circuit 10, are signals based on different frequencies. The frequency of the memory core portion is suppressed low so that it can operate stably as a DRAM, and one data reading/writing operation for the memory core portion is performed in parallel for a plurality of data.

Then, a plurality of data which are read/written in parallel from/to the memory core portion are converted to serial data and successively input/output by the data input/output control portion capable of a high frequency operation. It is therefore possible to attain a high speed operation as the entire semiconductor memory device.

FIG. 15 is a conceptual diagram illustrating data parallel/serial conversion during outputting data in semiconductor memory device 500.

Referring to FIG. 15, one reading operation causes memory mat MT0 to output eight pieces of data DT0<0> to DT0<7> in parallel. In the following, a plurality of data simultaneously processed in parallel are also referred to as a multiple-bit signal collectively. For example, DT0<0> to DT0<7> are also collectively referred to as DT0<0:7>. Similarly, the nth memory mat MTn outputs DTn<0:7> in parallel.

As an example, data outputting from memory mat MT0 will be described. Eight pieces of data DT0<0:7> which are simultaneously read out from memory mat MT0 in parallel are input to data conversion circuit 50-0 in parallel.

Data conversion circuit 50-0 outputs the parallel data one by one in series to input/output buffer 60-0 according to a data input/output control clock CLKIO which is one of data I/O control signals generated by control circuit 10. Output buffer 60-0 outputs data DQ0 to data node Nd0 according to signal level output from data conversion circuit 50.

Similarly, for other memory mats, parallel/serial conversion of data is carried out by data conversion circuits 50-1 to 50-n and output buffers 60-1 to 60-n, and data can be output from data nodes Nd1 to Ndn at a frequency higher than the operating frequency of the memory core portion.

FIG. 16 is a timing chart illustrating data outputting of semiconductor memory device 500.

Referring to FIG. 16, data is input and output at data nodes Nd0 to Ndn in response to both rising and falling edges of data input/output control clock CLKIO.

In semiconductor memory device 500, data nodes Nd0 to Ndn are provided for memory mats MT0 to MTn, respectively. Therefore, data nodes Nd0 to Ndn deal with data which are input/output in parallel for corresponding memory mats. For example, data DQ0 transmitted at data node Nd0 is data associated with memory mat MT0.

In outputting data, data DT0<0:7> to DTn<0:7> read out in parallel from the memory mats prior to clock activation timing at time T0 are output in series from the data nodes for clock activation edges at time T0 to T7.

As described above, by performing one reading/writing operation of the memory core portion which constitutes a DRAM in parallel for a plurality of data and by inputting/outputting data to/from an external unit using parallel/serial conversion of data, data can be input and output at a frequency higher than the operating frequency of the memory core portion. Thus, the data input/output cycle that is limited by the access time of a DRAM which forms a memory core portion can be further shortened, and the number of data which are input/output in parallel for the memory core portion during one reading/writing operation can be increased, which allows a higher frequency operation as the entire semiconductor memory device.

However, in attaining the higher frequency operation of a semiconductor memory device, a device for testing the semiconductor memory device itself hereinafter, also referred to as a memory tester) also requires higher performance which enables a higher frequency. Thus, the memory tester to be used becomes expensive. Therefore, in the semiconductor memory device for performing a high frequency operation using parallel/serial conversion of data, cost reduction for an operational test is important.

SUMMARY OF THE INVENTION

An object of the present invention is to provide a semiconductor memory device configuration allowing a high frequency operation based on a data parallel/serial conversion function and capable of efficiently performing an operational test.

In summary, the present invention is a semiconductor memory device including a plurality of input/output nodes, a memory core portion, a plurality of data conversion circuits, and a test mode circuit.

Each of the plurality of input/output nodes inputs and outputs a signal in series. The memory core portion is provided to store a data signal, and includes a plurality of memory cells arranged in rows and columns and a plurality of data lines each transmitting the data signal. The plurality of data conversion circuits are arranged between a plurality of internal nodes provided corresponding to the plurality of input/output nodes and the plurality of input/output nodes. Each data conversion circuit receives M (M is a natural number of at least 2) signals transmitted in parallel from the memory core portion to a corresponding one of the plurality of internal nodes, and transmits the signals in series to a corresponding one of the plurality of input/output nodes. The test mode circuit is arranged between the plurality of internal nodes and the memory core portion, and includes a plurality of data compression circuits each arranged for N (N is a natural number of at least 2) data lines. In a test mode, each data compression circuit generates K (K is a natural number smaller than N) test result signals according to the N data signals transmitted by the N data lines. In the test mode, the test mode circuit transmits M signals, at a time, of the plurality of test result signals generated by the plurality of data compression circuits in parallel to each of part of the internal nodes of the plurality of internal nodes.

Therefore, a main advantage of the present invention is that, in the test mode, test results on the basis of a prescribed unit corresponding to N data lines can be converted to serial/parallel data by the data conversion circuits and read out by using data nodes fewer than in a normal operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
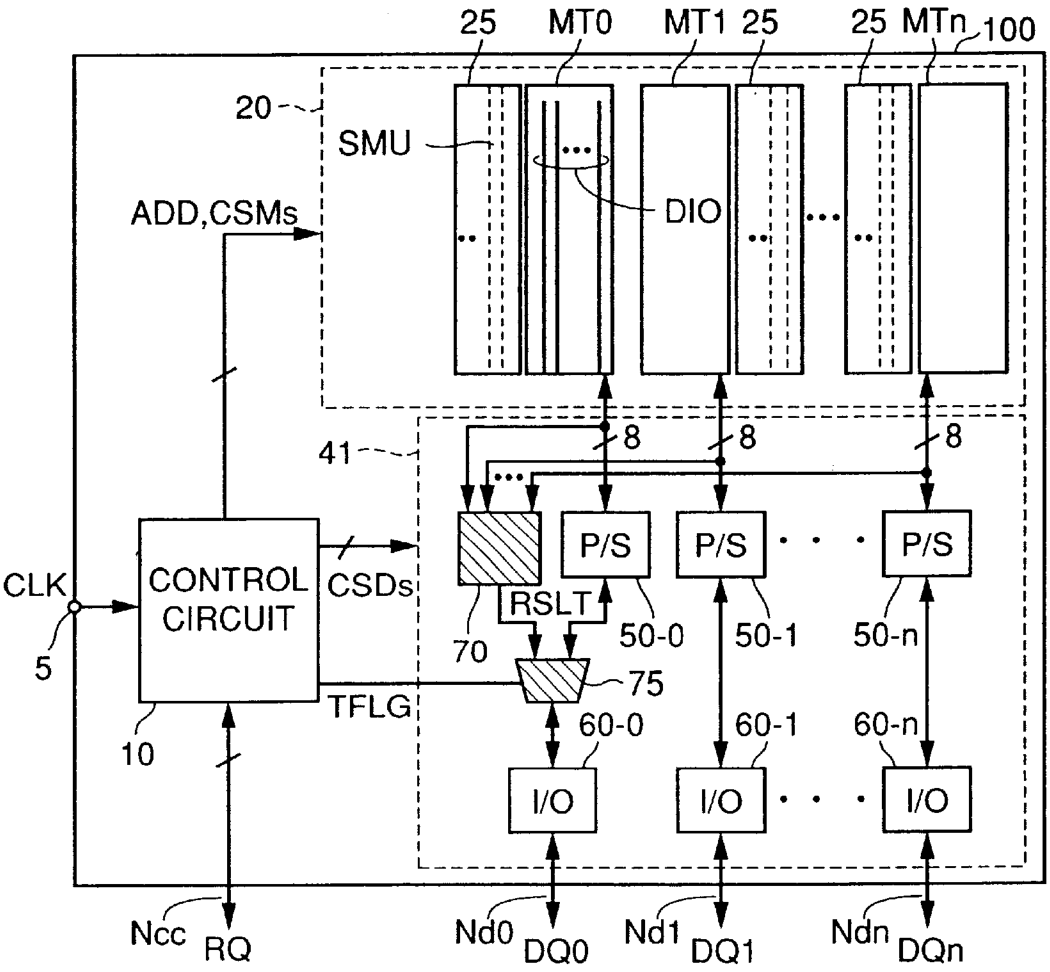
FIG. 1 is a schematic block diagram showing a configuration of a semiconductor memory device 100 capable of compressing and outputting operational test result data.

In the following, the embodiments of the present invention will be described in detail with reference to the drawings. The same reference characters denote the same or corresponding parts throughout the drawings.

Compression of Test Result Data

During an operational test (hereinafter, also referred to as a test mode) of a semiconductor memory device, data and control signals used for testing are transmitted to and from a memory tester through a control signal node and a data node. Therefore, as a method of reducing the test cost of the semiconductor memory device, the number of I/O pins used during the operational test is reduced, that is, the number of data nodes to which test result data are output is made smaller than in a normal operation so as to be able to increase the number of memory devices to be tested at the same time by one memory tester (hereinafter, also referred to as the number of simultaneously tested memory devices).

For an arrangement having a memory core portion operating at low speed and a data input/output control portion operating at high speed such as semiconductor memory device 500, the test cost can be reduced by performing the operational test of the memory core portion using a low frequency and relatively inexpensive memory tester and performing only the operational test of the data input/output portion using an expensive memory tester which can cope with a high speed. Such a method that carries out an operational test by directly accessing the memory core portion without accessing the data control input/output portion is also called a direct memory access mode.

Figure 15:
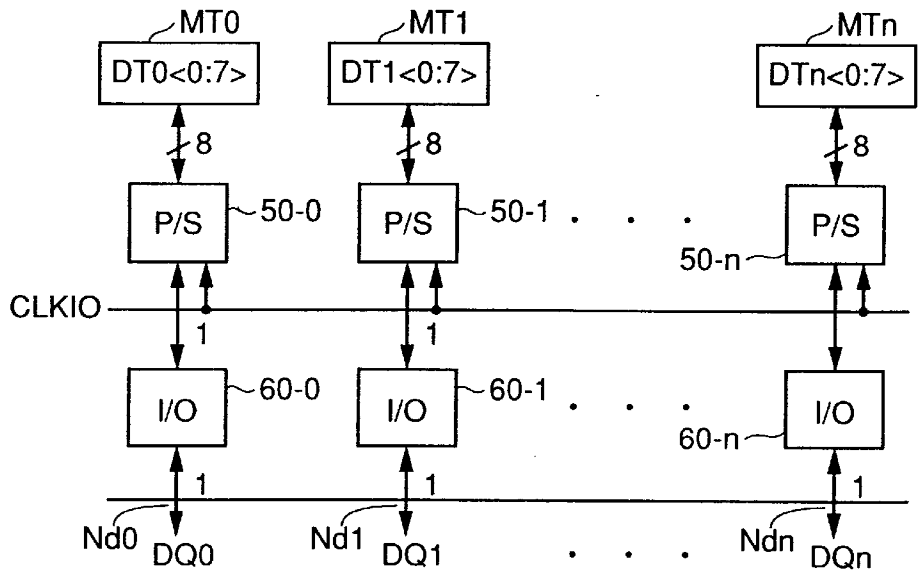
FIG. 15 is a conceptual diagram illustrating data parallel/serial conversion during outputting data in semiconductor memory device 500.
Figure 16:
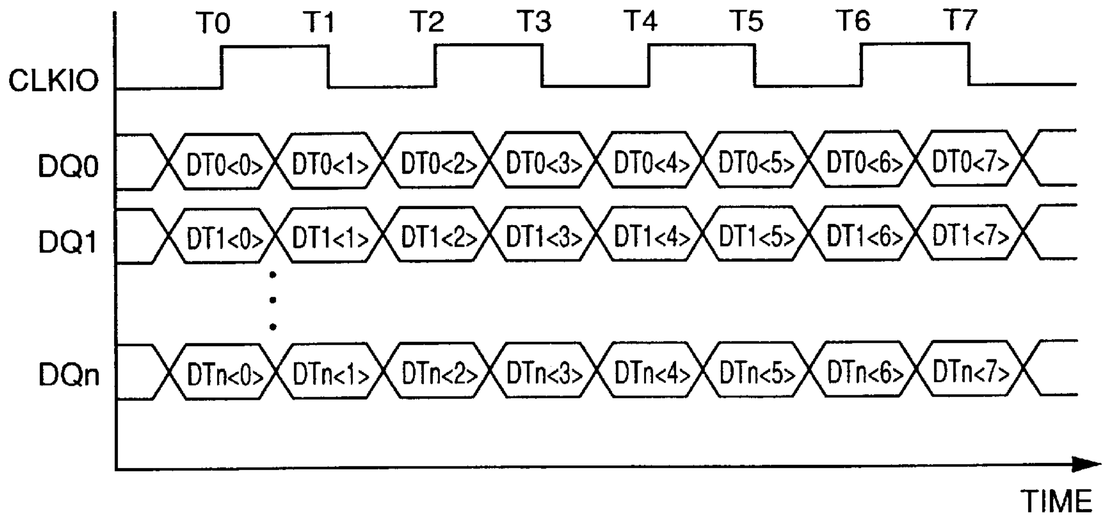
FIG. 16 is a timing chart illustrating data outputting of semiconductor memory device 500.

Even in the direct memory access mode, the flow of data input/output data is similar to the case of a normal operation as described with respect to FIGS. 15 and 16. The operational test cost can be reduced similarly by reducing I/O pins used during the operational test.

FIG. 1 shows a configuration of a semiconductor memory device 100 capable of compressing and outputting operational test result data, which is used for such a purpose.

Figure 14:
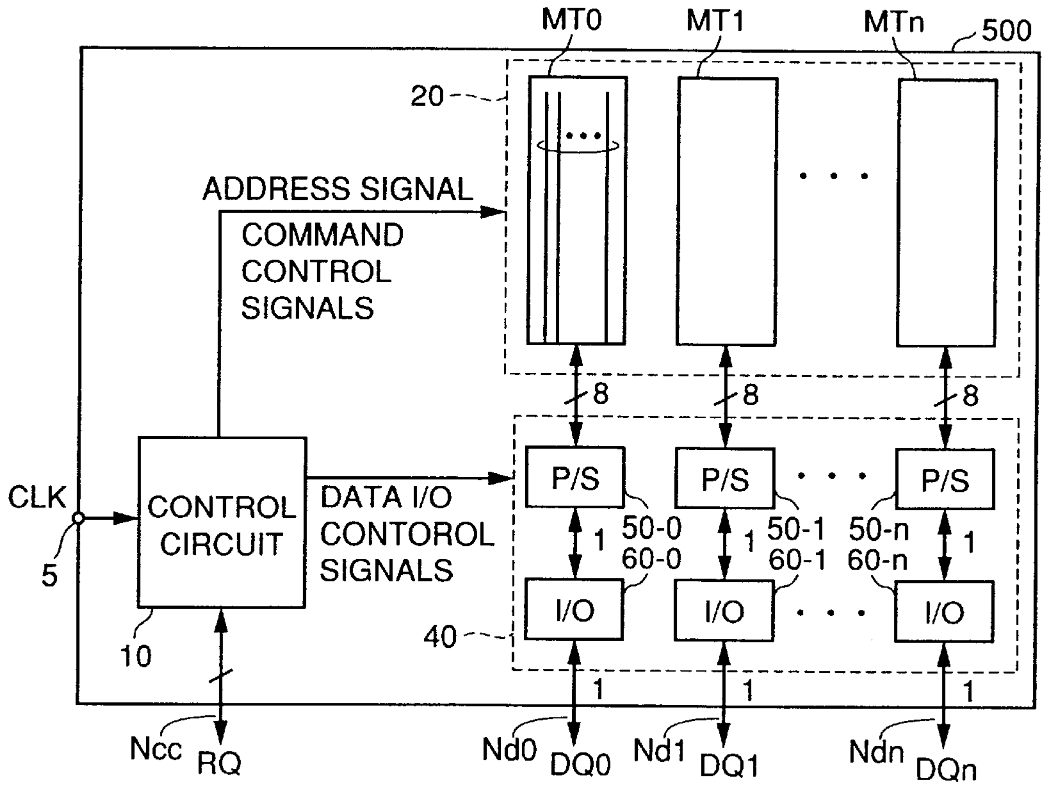
FIG. 14 is a schematic block diagram showing a configuration of a conventional semiconductor memory device 500 allowing higher speed interfacing by using parallel/serial conversion of data.

Referring to FIG. 1, semiconductor memory device 100 includes a memory core portion 20 and a data input/output control portion 41 similarly to semiconductor memory device 500 described with respect to FIG. 14.

Data input/output control portion 41 is different from data input/output control circuit 40 described with respect to FIG. 14 in that it has a determination data compression circuit 70 and an output switch circuit 75 in addition to data conversion circuits 50-0 to 50-n and input/output buffers 60-0 to 60-n.

Figure 2:
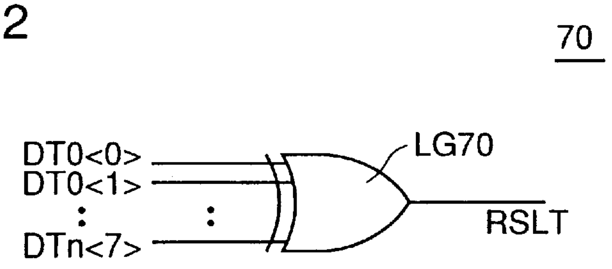
FIG. 2 shows a configuration example of a determination data compression circuit 70.

Referring to FIG. 2, determination data compression circuit 70 has an identity comparison (exclusive OR) gate LG70 which receives all data DT0<0>, DT0<1>, . . . , DTn<7> read out in parallel from memory core portion 20, for example. Logic gate LG70 outputs a signal RSLT indicating the determination result of an operational test.

In the operational test, if signals at the same level are written to a group of memory cells to be tested at a time, the existence of a defect in a corresponding region can be checked by carrying out identity comparison of output data.

In the example of FIG. 2, if the operational test result is normal, indicating that all the data read out at a time from memory core portion 20 are identical, determination result signal RSLT is activated (to logic low). On the contrary, if memory core portion 20 includes a defect, DT0<0> to DTn<7> are not perfectly identical and determination result signal RSLT is inactivated (to logic high). Thus, a failure of memory core portion 20 can be detected.

Referring again to FIG. 1, an output switch circuit 75 is provided corresponding to a data node Nd0. According to a test execution flag TFLG generated by control circuit 10, output switch circuit 75 outputs one of an output of data conversion circuit 50-0 and output signal RSLT of determination data compression circuit 70 to input/output buffer 60-0.

Test flag TFLG is activated in the test mode, and thus determination result signal RSLT is output instead of the output of data conversion circuit 50-0 to input/output buffer 60-0. In the normal operation, test flag TFLG is inactivated, and thus output switch circuit 75 transmits the output data of data conversion circuit 50-0 to input/output buffer 60-0 in order to output read data from memory core portion 20.

According to such a configuration, an operational test result in the test mode can be compressed and externally output through only one data node Nd0. It is therefore possible to reduce the number of data nodes used in the test mode and increase the number of simultaneously tested memory devices.

Although the configuration of semiconductor memory device 100 can obtain information on the existence of a defect in memory core portion 20 by the operational test, it cannot obtain information on where the defect is caused.

Specifically, a spare array portion 25 provided for obtaining a sufficient yield is divided into redundant units SMU each serving as a unit of replacing and repairing, and the replacing and repairing are performed for each redundant unit SMU. Therefore, if an operational test determination result is compressed beyond the redundant unit, it is not possible to identify a portion which needs to be repaired. If it is found out that memory core portion 20 has a defect, a more detailed test has to be performed and the operational test cost cannot be reduced as a whole.

First Embodiment

Figure 3:
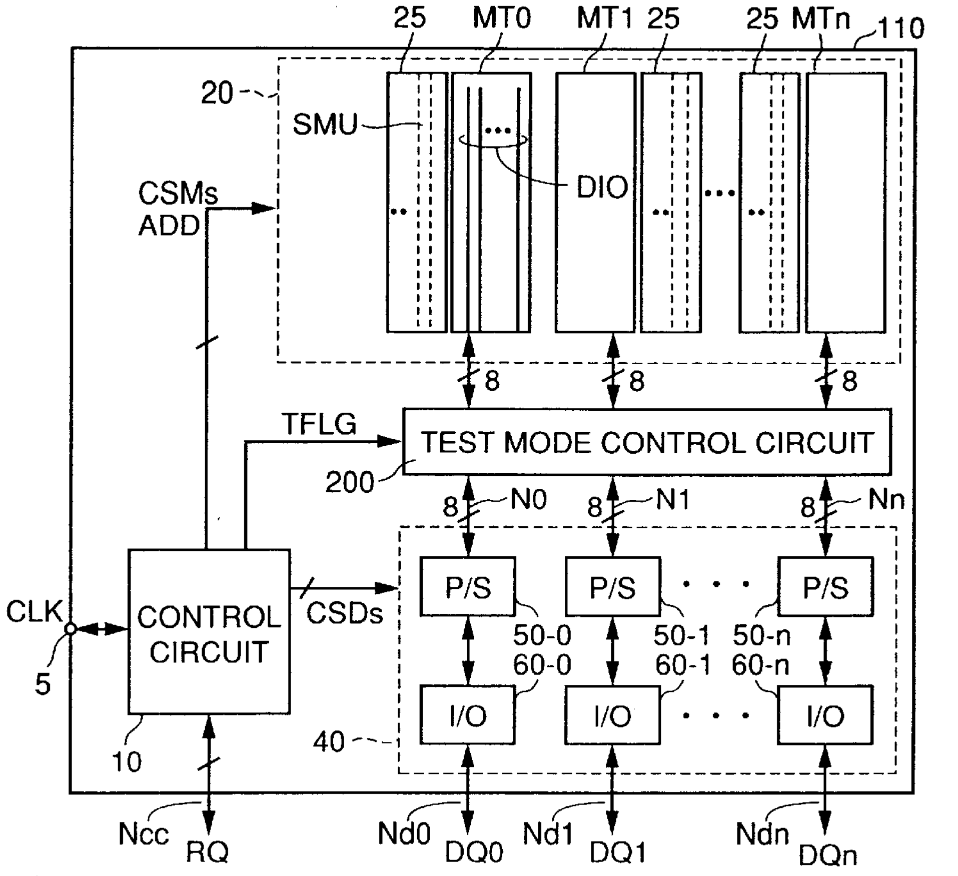
FIG. 3 is a block diagram showing a configuration of a semiconductor memory device 110 according to a first embodiment of the present invention.

Referring to FIG. 3, a semiconductor memory device 110 according to a first embodiment of the present invention includes a memory core portion 20, a test mode control circuit 200 for transmitting data output from memory core portion 20 to internal nodes N0 to Nn, a data input/output control circuit 40 for inputting/outputting in series a plurality of pieces of data, which are input/output at internal nodes N0 to Nn, to/from data nodes Nd0 to Ndn, and a control circuit 10 for generating signals for controlling an operation of the entire semiconductor memory device 110.

Memory core portion 20 has a configuration of a typical random access memory represented by a DRAM, and operates according to an address signal ADD and a plurality of command control signals CSMs generated by control circuit 10. Memory core portion 20 includes a plurality of memory mats MT0 to MTn (n is a natural number) and a plurality of spare array portions 25.

For each of memory mats MT0 to MTn, m pieces of data (m is a natural number) can be read and written in parallel. FIG. 3 shows the case of m=8 as an example. In other words, eight data I/O lines DIO are arranged in each memory mat, and m (=8) pieces of data are input/output to/from each memory mat according to the address signal and the command control signals generated by control circuit 10.

Spare array portion 25 has a plurality of redundant units SMU each of which functions as a unit of replacement and repair. If an address selected by address signal ADD is identical to a defect address which is programmed in advance, replacement and repair for each redundant unit SMU are carried out. In semiconductor memory device 110, replacement and repair of one redundant unit SMU are carried out on the basis of four data I/O lines.

Although spare array portion 25 is arranged for each memory mat in FIG. 3, spare array portion 25 may be shared by a plurality of memory mats.

The configuration of test mode control circuit 200 will be described in detail below. Test mode control circuit 200 controls signals transmitted to internal nodes N0 to Nn according to whether the operation is the normal reading operation or the test mode.

Test mode control circuit 200 transmits data output from memory core portion 20 as it is to internal nodes N0 to Nn in the normal reading operation, and compresses and transmits data output from memory core portion 20 to internal nodes N0 to Nn in the test mode.

Data input/output control portion 40 has a similar configuration to the data input/output control portion described with respect to FIG. 14, and performs parallel/serial conversion of data from eight pieces of parallel data transmitted to each of internal nodes N0 to Nn into one serial data transmitted by each of data nodes Nd0 to Ndn, and vice versa. In reading data, eight pieces of parallel data transmitted from a corresponding memory mat are transmitted to a corresponding internal node N0 to Nn in series through test mode control circuit 200.

Data input/output control portion 40 includes data conversion circuits 50-0 to 50-n provided corresponding to internal nodes N0 to Nn, and input/output buffers 60-0 to 60-n provided between data conversion circuits 50-0 to 50-n and data nodes Nd0 to Ndn.

In outputting data, data conversion circuits 50-0 to 50-n convert eight pieces of parallel data transmitted from the memory mats to serial data. Output buffers 60-0 to 60-n output the serial data transmitted from data conversion circuits 50-0 to 50-n as data DQ0 to DQn from data nodes Nd0 to Ndn.

When data nodes Nd0 to Ndn are provided on the same chip as a logic circuit as in a mixed DRAM, for example, they are connected to a data bus shared with the logic circuit. Furthermore, by providing for each data node a data input/output terminal capable of directly transmitting data to and from an external unit, an independent semiconductor memory device may also be formed. Similarly, control signal RQ may be connected to the system bus provided on the mixed DRAM or a terminal may be provided to which an external control signal can be directly input.

In this embodiment of the present invention, only the operation concerning outputting (reading) data will be described in detail as an operation of data input/output control portion 40. However, an operation based on parallel/serial conversion of data is possible even for inputting (writing) data. In this case, serial input data input from data nodes Nd0 to Ndn are transmitted to data conversion circuits 50-0 to 50-n through input/output buffers 60-0 to 60-n, and the data which are input in series are converted to parallel data by each data conversion circuit. Parallel data writing is performed for a corresponding memory mat without using test mode control circuit 200.

According to a clock signal CLK input to a clock terminal 5 and a control signal RQ input to a control signal node Ncc, control circuit 10 generates for memory core portion 20 an address signal ADD and command control signals CSMs for controlling access to memory core portion 20. Control circuit 10 also generates for data input/output control circuit 40 data input/output control signals CSDs for controlling data parallel/serial conversion and data input/output timing.

Control circuit 10 outputs, to the test mode control circuit, a test flag TFLG indicating whether the current operation mode is the normal operation mode or the test mode which corresponds to the time when the operational test is carried out.

Control circuit 10 enables a higher speed operation by operating memory core portion 20 inputting and outputting a plurality of data in one write and read operation at a relatively low frequency allowing a stable operation as a DRAM through using the control signals, by performing parallel/serial conversion of the plurality of data input/output in parallel to/from the memory core portion through using data input/output control circuit 40 operating at a high frequency, and by inputting/outputting the data in series at each data node. Thus, a higher speed operation is made possible.

In the following, a configuration of control circuit 10 will be described.

Figure 4:
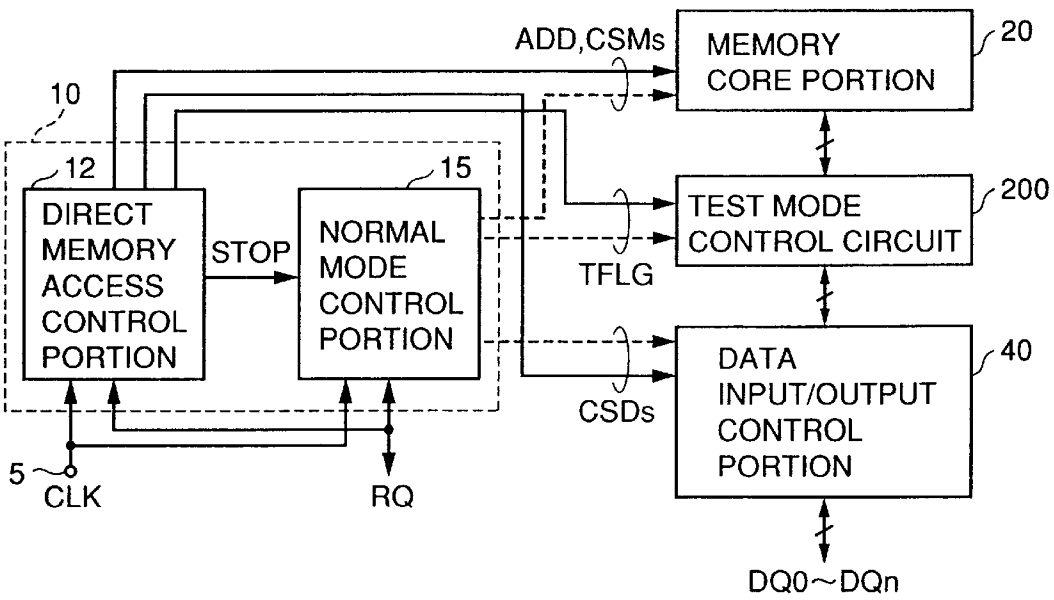
FIG. 4 is a block diagram showing a configuration of a control circuit 10.

Referring to FIG. 4, control circuit 10 includes a direct memory access control portion 12 and a normal mode control portion 15. Each of direct memory access control portion 12 and normal mode control portion 15 can generate address and control signals for memory core portion 20, test mode control circuit 200 and data input/output control portion 40 according to clock signal CLK input to clock terminal 5 and control signal RQ.

When direct memory access is designated by control signal RQ, direct memory access control portion 12 generates address signal ADD and command control signals CSMs. In this case, normal mode control portion 15 is directed to stop its operation and stops generation of the signals.

In FIG. 4, the supply of address signal ADD and control signals CSMs, TFLG, CSDs in the direct memory access mode is shown by solid lines, and the supply of these signals in the normal mode is shown by dash lines.

According to such a configuration, in the direct memory access mode, memory core portion 20 can be operated according to clock signal CLK supplied to clock terminal 5 by a low speed memory tester, and a signal indicating the operational test result can be output from data nodes Nd0 to Ndn through test mode control circuit 200 and data input/output control portion 40.

Figure 5:
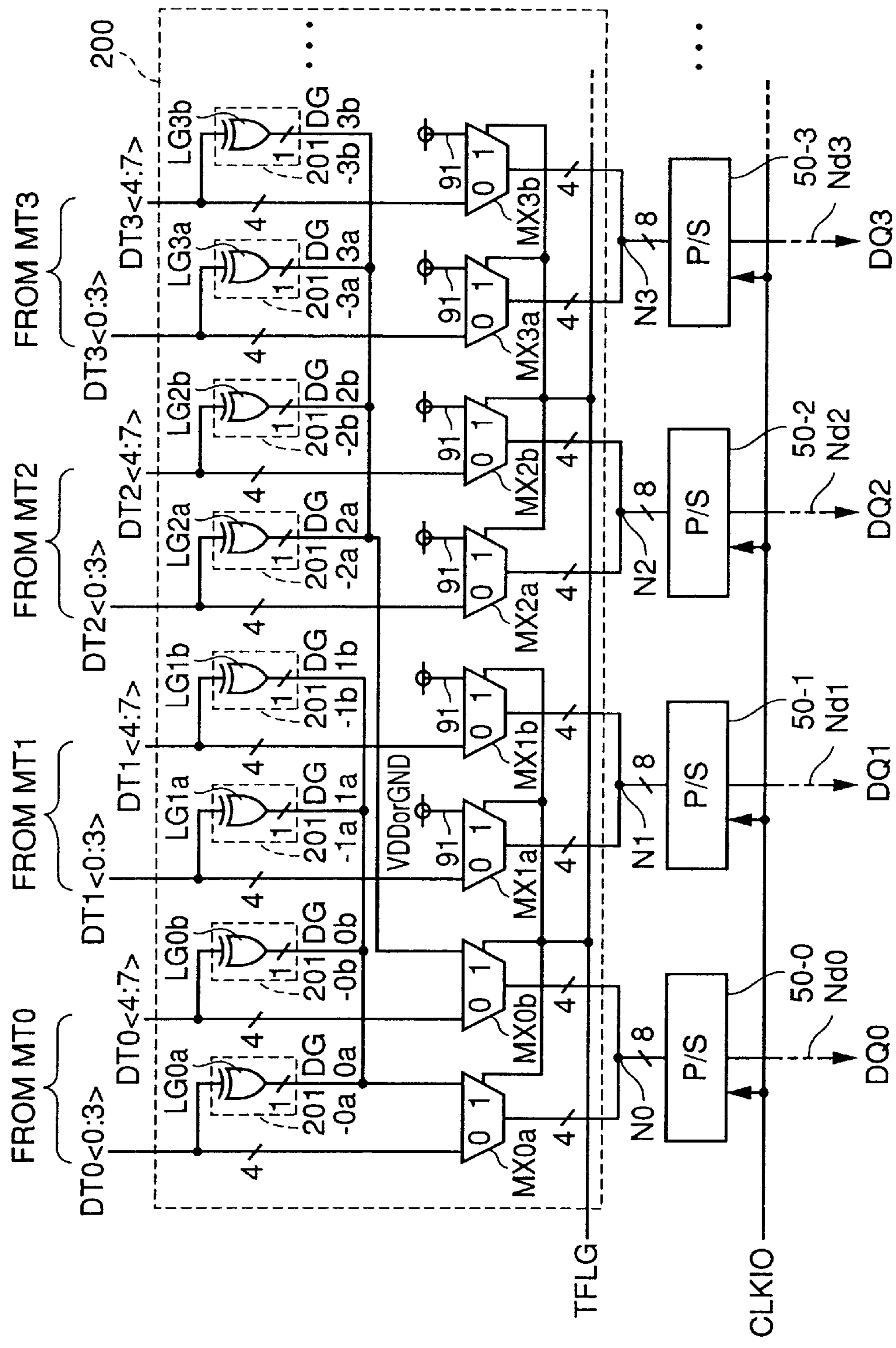
FIG. 5 is a circuit diagram showing a configuration of a test mode control circuit 200.

FIG. 5 shows a configuration of test mode control circuit 200. In FIG. 5, a portion corresponding to memory mats MT0 to MT3 of the entire test mode control circuit 200 is representatively shown. For other memory mats as well, a similar configuration is provided.

Referring to FIG. 5, test mode control circuit 200 includes data compression circuits 201-0*a* to 201-3*b* and multiplexers MX0*a* to MX3*b* arranged for four pieces of output data (that is, four data I/O lines). The data compression circuit is arranged for four pieces of output data to correspond to the unit of replacement and repair by one redundant unit SMU in semiconductor memory device 110. Data compression circuits 201-0*a* to 201-3*b* respectively have identity comparison gates (exclusive OR gates) LG0*a* to LG3*b* in the example of FIG. 5.

Data outputting from memory mats MT0 and MT1 will be described as an example.

Data compression circuits 201-0*a*, 201-0*b*, 201-1*a* and 201-1*b* are provided for data DT0<0:3>, DT0<4:7>, DT1<0:3> and DT1<4:7>, respectively.

Data compression circuit 201-0*a* activates (to logic low, "0") a compression determination signal DG0*a* when the signal levels of corresponding four pieces of data DT0<0:3> are identical. When the signal levels of four pieces of data DT0<0:3> are not identical, data compression circuit 201-0*a* inactivates compression determination signal DG0*a* (to logic high, "1").

Similarly, data compression circuits 201-0*b*, 201-1*a* and 201-1*b* respectively output compression determination signals DG0*b*, DG1*a* and DGlb according to whether the signal levels of corresponding four pieces of read data are identical or not.

The four compression determination signals generated by data compression circuits 201-0*a* to 201-1*b* are transmitted to multiplexer MX0*a*. Multiplexer MX0*a* operates according to test flag TFLG.

When test flag TFLG is inactive (logic low, "0"), that is, in the normal mode, data DT0<0:3> read out from the memory mat and input to the "0" side is transmitted as it is to internal node N0.

When test flag TFLG is active (logic high, "1"), that is, in the test mode, the four compression determination signals input to the "1" side are transmitted to internal node N0.

Similarly, memory mats MT2 and MT3 are also provided with the data compression circuits and the multiplexers.

Therefore, in the normal reading operation, each multiplexer outputs data on the "0" side, and thus parallel data output from each memory mat are transmitted to internal nodes N0 to N3 and output from data nodes Nd0 to Nd3 through data conversion circuits 50-0 to 50-3.

In the test mode, data signals indicating operational test results output from memory mats MT2 and MT3 are compressed by data compression circuits 201-2*a*, 201-2*b*, 201-3*a* and 201-3*b* and input to multiplexer MX0*b*. Thus, the operational test results associated with memory mats MT0 to MT3 are compressed into eight signals and output from one data node Nd0 by data conversion circuit 50-0.

Therefore, in the test mode, if data DQ0 output from data node Nd0 is checked, the existence of a defect in memory mats MT0 to MT3 can be found out. Thus, the number of I/O pins used in the test mode can be reduced to ¼ times the number in the normal operation, and the number of simultaneously tested memory devices can be increased four times.

Since data output in the test mode is compressed for each replacement and repair unit, the existence of a defect can also be checked for each redundancy and repair unit. In other words, by checking data DQ0, it is possible to identify not only the existence of a defect in the entire memory core portion 20 but a replacement and repair unit with the defect.

Since the existence of a defect and data necessary for replacement and repair can be obtained by one operational test, an efficient operational test can be carried out.

In any of the normal reading operation and the test mode, the function necessary for data conversion circuits 50-0 to 50-n and circuits thereafter is to transmit eight pieces of parallel data, which are transmitted to corresponding internal nodes N0 to Nn, one by one as serial data to corresponding data nodes Nd0 to Ndn. Therefore, they can have the same configuration as data input/output control portion 40 described in the conventional art. According to the semiconductor memory device in the first embodiment, the operational test cost can be reduced by increasing the number of simultaneously tested memory devices without modifying data input/output control portion 40 performing a high frequency operation.

In the test mode, data nodes Nd1 to Nd3 are not used for outputting data. Therefore, a power supply node 91 for fixing an output level is coupled to the "1" side of each of multiplexers MX1*a* MX1*b*, MX2*a*, MX2*b*, MX3*a* and MX3*b* provided for these data nodes.

Power supply node 91 is supplied with one of a ground potential GND and a power supply potential VDD corresponding to logic low and high levels of data. In the test mode, therefore, the potential level of a data node not used for outputting data can be prevented from falling into an undetermined state.

Figure 6:
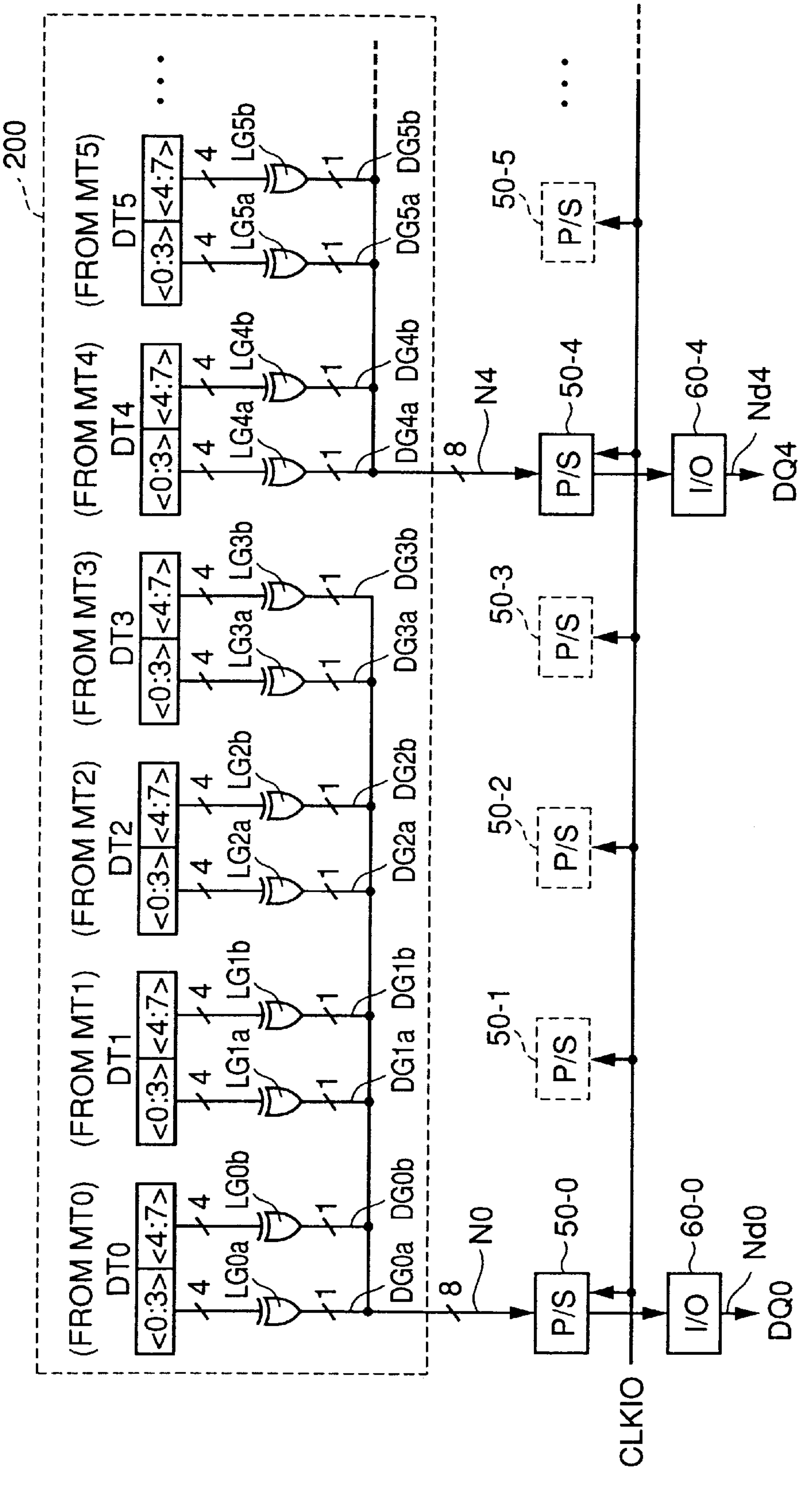
FIG. 6 is a block diagram illustrating data outputting in a test mode of test mode control circuit 200.

FIG. 6 shows data outputting of test mode control circuit 200 in the test mode. In FIG. 6, a portion corresponding to memory mats MT0 to MT5 of the entire test mode control circuit 200 is representatively shown.

Referring to FIG. 6, in the test mode, data read out in parallel from the memory mats are input to the data compression circuits such that four pieces of data are input to a corresponding compression circuit. The data compression circuits output compression determination signals indicating the existence of a defect in a corresponding replacement and repair unit.

Eight compression determination signals DG0*a* to DG3*b* are transmitted to internal node Nd0. Data conversion circuit 50-0 which operates according to data input/output control clock CLKIO outputs eight compression determination signals DG0*a* to DG3*b* one by one in series from data node Nd0 through input/output buffer 60-0. According to such a configuration, in the test mode, the determination data associated with memory mats MT0 to MT3 can be compressed for each replacement and repair unit and taken out from one data node Nd0, and therefore the number of simultaneously tested memory devices can be increased.

For memory mats MT4 and thereafter, the determination results compressed for each replacement and repair with respect to four memory mats can also be output from one data node.

Figure 7:
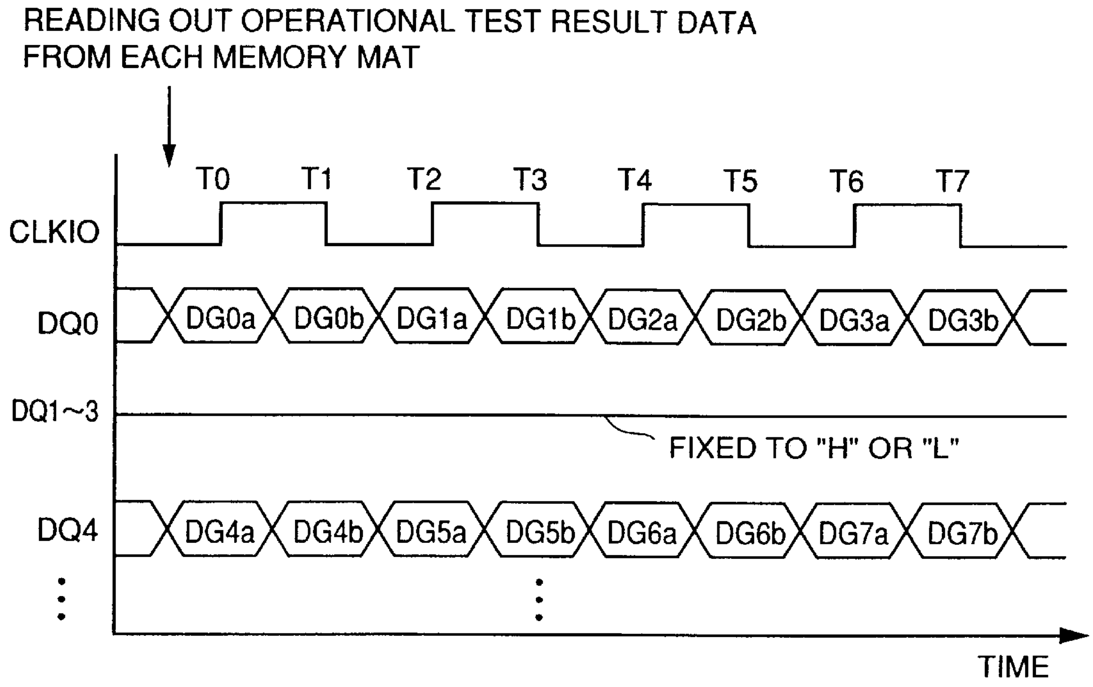
FIG. 7 is a timing chart illustrating data outputting in the test mode of semiconductor memory device 110.

FIG. 7 is a timing chart illustrating data outputting in the test mode of semiconductor memory device 110.

Referring to FIG. 7, data is input and output at a data node in response to both rising and falling edges of data input/output control clock CLKIO.

In the test mode, data indicating the operational test results read out in parallel from the memory mats before time T0 become the compression determination signals compressed for each replacement and repair unit, and the signals are output from the data compression circuits. Compression data DG0*a* to DG3*b* associated with memory mats MT0 to MT3 are output one by one in series as data DQ0 from data node Nd0 at clock edge time T0 to T7.

Similarly, data indicating the operational test results associated with memory mats MT4 to MT7 become the compression determination signals compressed for each replacement and repair unit, and the signals are output one by one in series as data DQ4 from input/output node Nd4 at clock edge time T0 to T7.

Meanwhile, a potential level which is fixed by power supply node 91 shown in FIG. 5 is output to data nodes Nd1 to Nd3.

Second Embodiment

In a second embodiment, a configuration capable of improving the reliability of data compression of a determination result as compared with the first embodiment will be described.

In the second embodiment, the test mode control circuit has a different configuration from that of semiconductor memory device 110 shown in FIG. 3. Since other circuit configuration and operation are similar to those of semiconductor memory device 110, description thereof will not be repeated.

Figure 8:
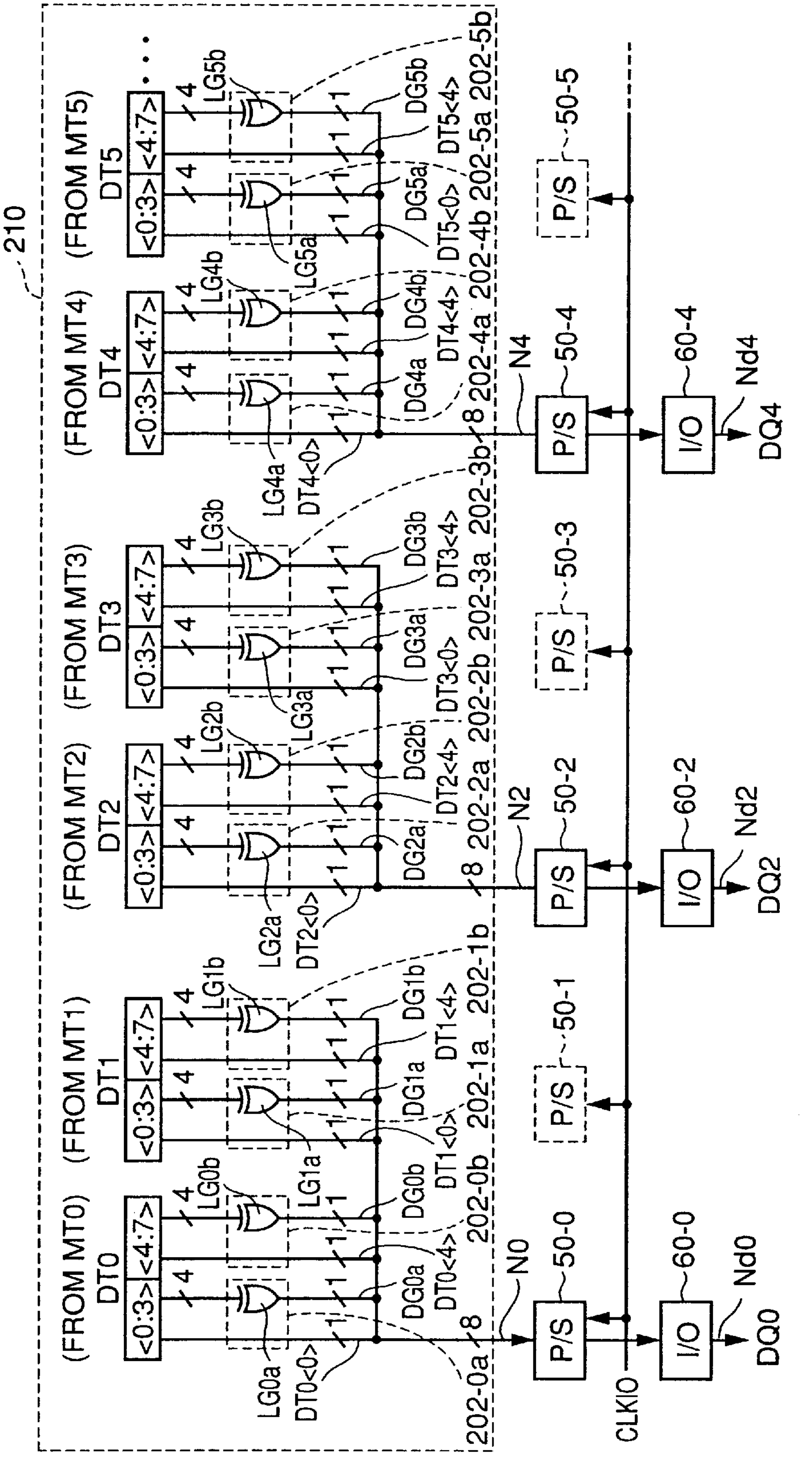
FIG. 8 is a diagram illustrating data outputting in a test mode of a test mode control circuit 210 according to a second embodiment.

FIG. 8 shows data outputting in a test mode of a test mode control circuit 210 according to the second embodiment.

In the first embodiment, data compression is performed based on identity comparison using an exclusive OR gate. Therefore, even if defects exist for all four pieces of data to be compressed, the compression determination signal indicates the determination result of "good." Taking this problem into account, the second embodiment aims to further improve the reliability of data compression.

In FIG. 8, a portion corresponding to memory mats MT0 to MT5 of the entire test mode control circuit 210 is representatively shown. However, other memory mats also have a similar configuration.

Referring to FIG. 8, test mode control circuit 210 is characterized in that each data compression circuit further outputs one of four pieces of data prior to compression (uncompressed data) in addition to the compression determination signal output from a corresponding identity comparison gate.

For example, in the test mode, uncompressed data DT0<0> and DT0<4> are transmitted, as output data associated with memory mat MT0, to internal node N0 in addition to compression determination signals DG0*a* and DG0*b* described above. It is noted that uncompressed data to be output can be arbitrarily selected and DT0<0> and DT0<4> are selected as an example.

For memory mat MT1 as well, DT1<0> and DT1<4> as part of uncompressed data are transmitted to internal node N1 in addition to compression determination signals DG1*a* and DG1*b*.

Therefore, in the test mode, data conversion circuit 50-0 can output one of uncompressed data corresponding to the compression determination signals. Since both the uncompressed data and the compression determination signals can be checked, the existence of a defect for each replacement and repair unit can be detected more reliably.

In short, as shown in FIG. 8, the test results from memory mats MT0 and MT1 can be output as output data DQ0, and the test results from memory mats MT2 and MT3 can be output as data DQ2. As a result, the number of data nodes to be used in the test mode is ½ times that in the normal operation.

Therefore, in the second embodiment, the number of data output for each replacement unit in the test mode is two times as large as in the first embodiment. Thus, the number of simultaneously tested memory devices is ½ times that in the first embodiment.

Figure 9:
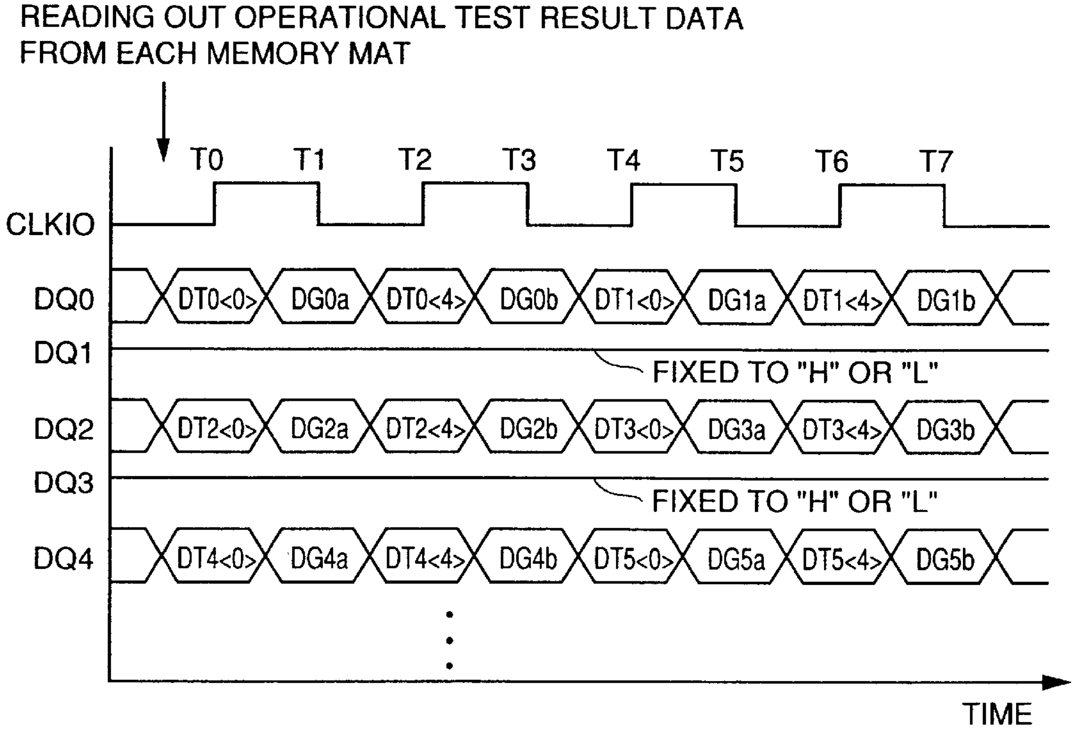
FIG. 9 is a timing chart illustrating data outputting in the test mode of test mode control circuit 210.

FIG. 9 is a timing chart for illustrating data outputting in the test mode of test mode control circuit 210.

Referring to FIG. 9, data node Nd0 outputs, as data DQ0, operational test results corresponding to memory mats MT0 and MT1 in the test mode. Similarly, data node Nd2 outputs, as data DQ2, operational test results corresponding to memory mats MT2 and MT3. Data node Nd4 outputs, as data DQ4, operational test results corresponding to memory mats MT4 and MT5.

In the normal operation, the signal levels of data nodes Nd1 and Nd3 which input and output data corresponding to memory mats MT1 and MT3 are fixed in the test mode.

Prior to time T0, data indicating operational test results are read out in parallel from the memory mats, and four compression determination signals and four pieces of uncompressed data are transmitted to the internal nodes.

In response to time T0 to T3 corresponding to clock edges of data input/output control clock CLKIO, data node Nd0 outputs uncompressed data DT0<0>, compression determination signal DG0*a*, uncompressed data DT0<4> and compression determination signal DG0*b* one by one in series as data DQ0. Similarly for clock edges at time T4 to T7, DT1<0>, DG1*a*, DT1<4> and DG1*b* as uncompressed data and compression determination signals corresponding to memory mat MT1 are output.

Similarly, data nodes Nd2 and Nd4 output four compression determination signals and four pieces of uncompressed data corresponding to memory mats MT3, MT4 and memory mats MT5, MT6, respectively, one by one in series for clock edges at time T0 to T7.

Third Embodiment

Figure 10:
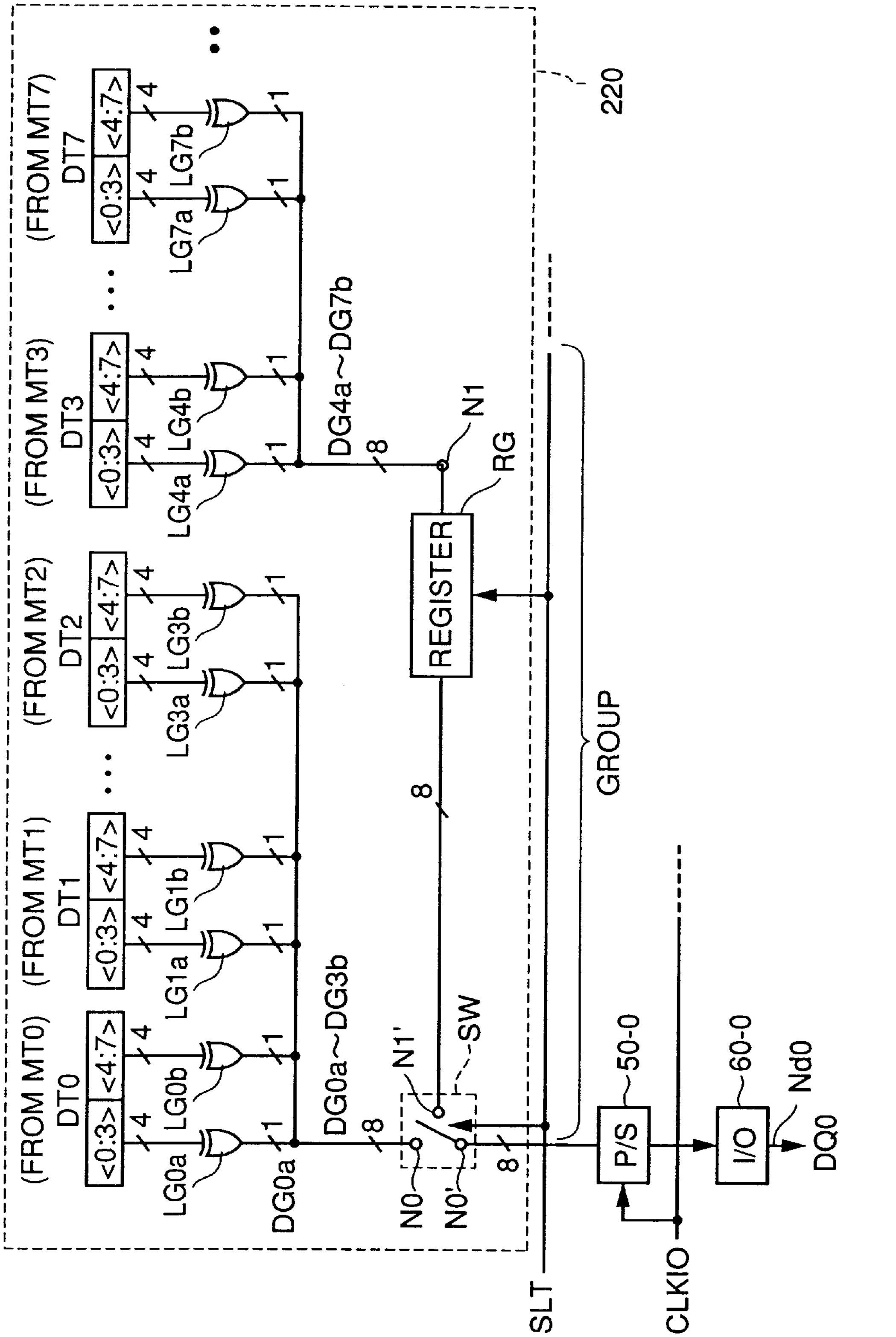
FIG. 10 is a diagram illustrating data outputting in a test mode of a test mode control circuit 220 according to a third embodiment.

FIG. 10 shows data outputting in a test mode of a test mode control circuit 220 according to a third embodiment. In FIG. 10, a portion 632 corresponding to memory mats MT0 to MT7 of the entire test mode control circuit 220 is representatively shown. However, other memory mats also have a similar configuration.

Test mode control circuit 220 is different from test mode control circuit 200 shown in FIG. 6 in that it further includes a data register RG and a data switch SW.

In the third embodiment, internal nodes N0 to Nn are divided into a plurality of groups each including L (L is a natural number of at least 2) internal nodes. Data switch SW is arranged for one of L internal nodes constituting each group, and data register RG is arranged for remaining (L−1) internal nodes. In FIG. 10, the case of L=2 is shown as an example.

Since data compression in test mode control circuit 220 is similar to test mode control circuit 200 described in the first embodiment, description thereof will not be repeated. In short, each data compression circuit performs data compression for every four pieces of read data corresponding to a replacement and repair unit, and outputs a compression determination signal.

Eight compression determination signals DG0*a* to DG3*b* corresponding to memory mats MT0 to MT3 are transmitted to internal node N0. On the other hand, eight compression determination signals DG4*a* to DG7*b* corresponding to memory mats MT4 to MT7 and transmitted to internal node N1 are stored in data register RG and output to a node N1'.

According to a control signal SLT, data switch SW connects one of internal node N0 and node N1' to a node N0' corresponding to an input node of data conversion circuit 50-0.

According to control signal SLT, data register RG receives and holds signals transmitted in parallel to internal node N1 and outputs the signals to node N1'.

According to L=2, control signal SLT has a frequency ¼ times as high as data input/output control clock CLKIO. Therefore, the signal level of control signal SLT changes for every four cycles of clock CLKIO. In response, data stored in data register RG are updated and the connection direction of data switch SW is changed. Thus, for every four cycles of data input/output control clock CLKIO, eight compression determination signals corresponding to memory mats MT0 to MT3 and transmitted to internal node N0 and eight compression determination signals corresponding to MT4 to MT7 and transmitted to node N1' through internal node N1 are transmitted, in order, to data conversion circuit 50-0.

Thus, in the test mode, the test data associated with memory mats MT0 to MT7 can be output only by data node Nd0. In the test mode, data nodes DQ1 to DQ7 do not have to output data. As a result, the number of data nodes to be used is ⅛ times that in the normal operation, which makes it possible to further increase the number of simultaneously tested memory devices as compared with the first embodiment.

Figure 11:
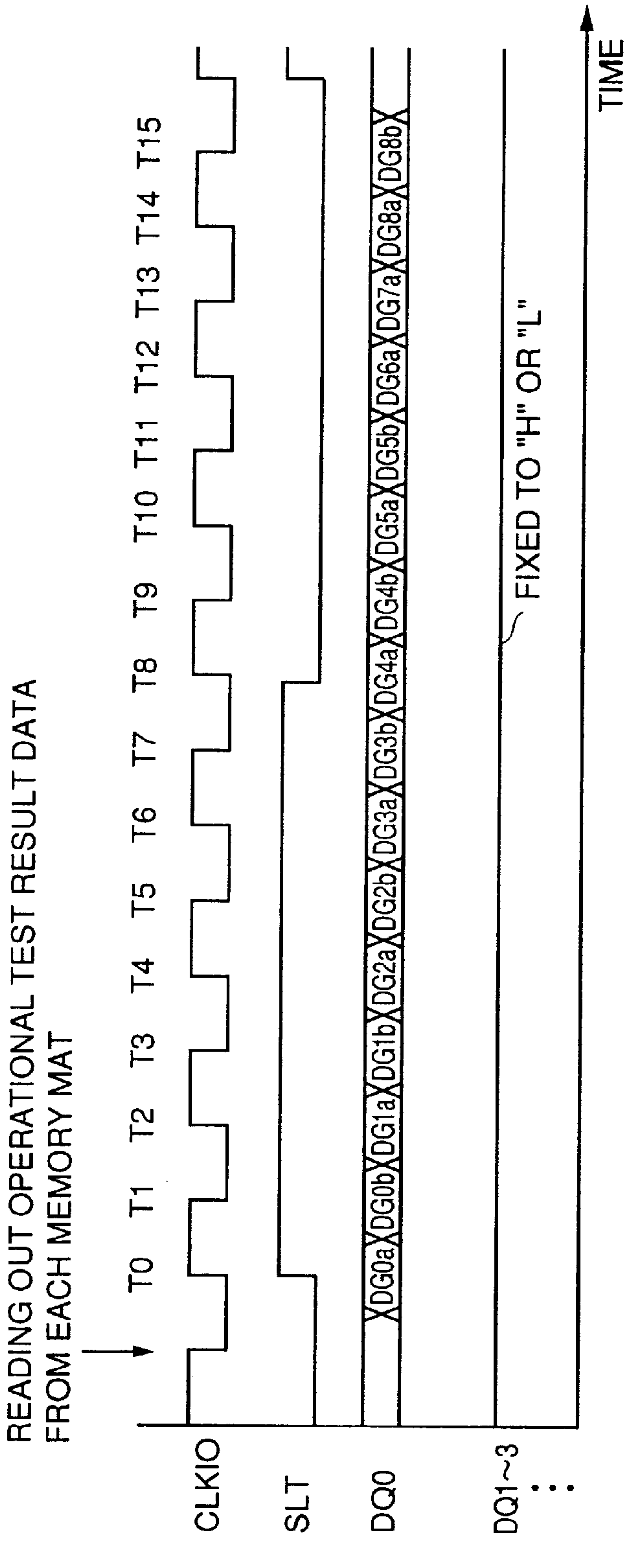
FIG. 11 is a timing chart illustrating data outputting in the test mode of test mode control circuit 220.

FIG. 11 shows a timing chart illustrating data outputting in the test mode of test mode control circuit 220.

Referring to FIG. 11, prior to time T0 corresponding to an activation edge of data input/output control clock CLKIO, data indicating operational test results read out in parallel from the memory mats serve as compression determination signals compressed for each replacement and repair unit, and are output from the data compression circuits.

Thus, compressed test data corresponding to memory mats MT0 to MT3 and MT4 to MT7 are respectively transmitted to internal nodes N0 and N1.

For clock edges at time T0 to T7, compression determination signals corresponding to memory mats MT0 to MT3 are output one by one in order of DG0*a*, DG0*b*, . . . , DG3*b* as data DQ0.

Prior to a clock activation edge at time T8, the signal level of control signal SLT is inverted, and compression determination signals corresponding to memory mats MT4 to MT7 and transmitted to internal node N1 are held in data register RG and output to node N1'. Data switch SW changes the connection direction and connects internal node N0 to node N1'. Thus, compression determination signals DG4*a* to DG7*b* held in data register RG are transmitted to data conversion circuit 50-0.

Thereafter, for clock edges at time T8 to T15, compression determination signals DG4*a*, DG4*b*, . . . , DG7*b* are output one by one in series as DQ0. At time T8, the next compression determination signals corresponding to the memory mats are output in parallel and transmitted to internal nodes N0 and N1. At this timing, however, since internal node N0 and node N0' are not connected and data register RG does not capture signals transmitted to internal node N1, the compression determination signals corresponding to memory mats MT4 to MT7 and output before time T0 can be output normally.

Fourth Embodiment

In a fourth embodiment, the configurations described in the second and third embodiments are combined to improve the reliability of data compression and increase the number of simultaneously tested memory devices.

Figure 12:
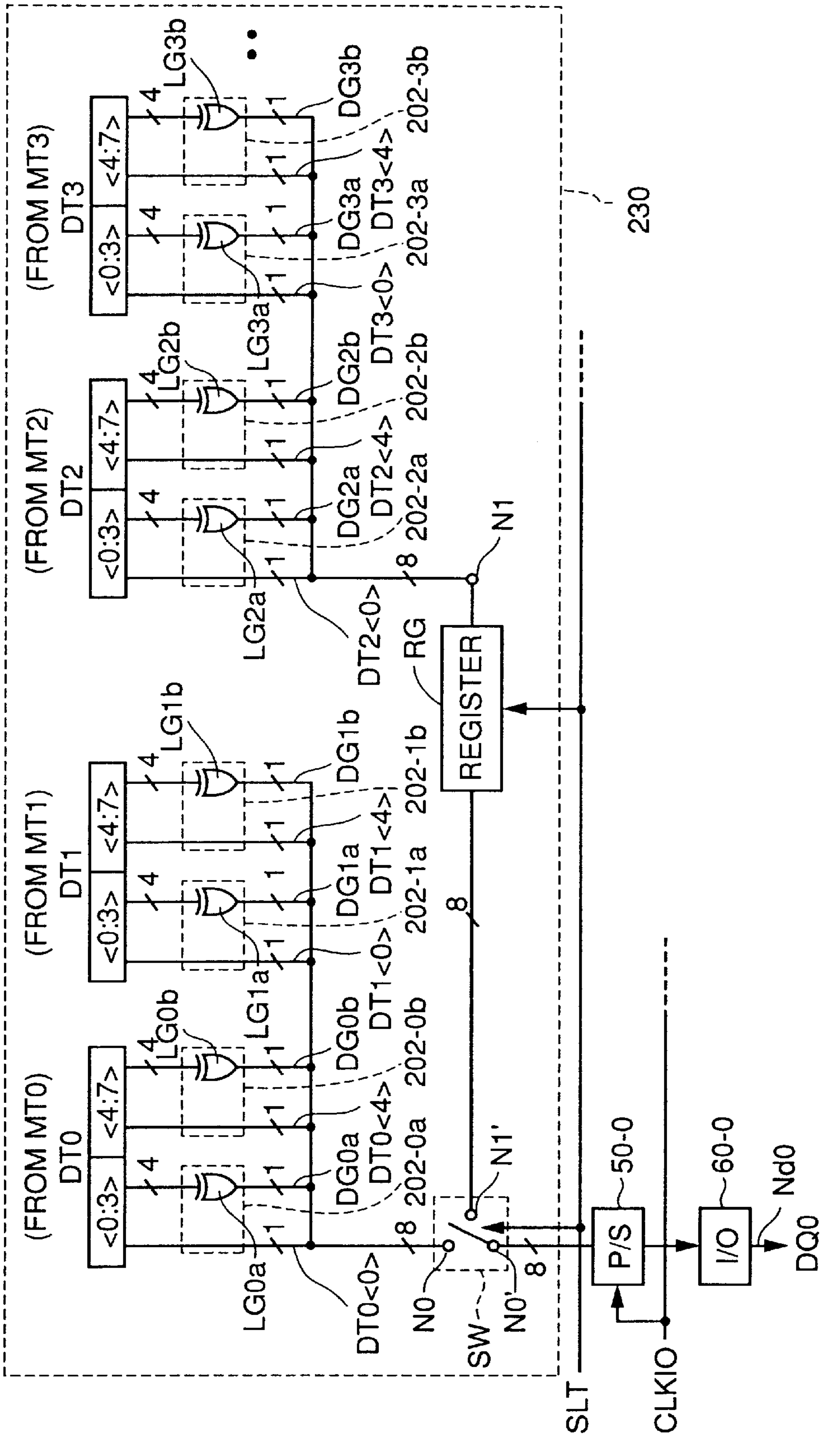
FIG. 12 is a diagram illustrating data outputting in a test mode of a test mode control circuit 230 according to a fourth embodiment of the present invention.

FIG. 12 shows data outputting in a test mode of a test mode control circuit 230 according to the fourth embodiment of the present invention. In FIG. 12, a portion corresponding to memory mats MT0 to MT3 of the entire test mode control circuit 230 is representatively shown. However, other memory mats also have a similar configuration.

Referring to FIG. 12, test mode control circuit 230 includes a data register RG and a data switch SW in addition to the configuration of test mode control circuit 210 shown in FIG. 8.

Since the arrangement and operation of data register RG and data switch SW are similar to those of the third embodiment, description thereof will not be repeated. FIG. 12 shows the case of L=2.

Since data compression in test mode control circuit 230 is similar to the second embodiment, description thereof will not be repeated. In short, each data compression circuit outputs one piece of data prior to compression in addition to compression determination signals compressed for every four pieces of read data corresponding to a replacement and repair unit.

According to such a configuration, it is possible to improve the reliability of data compression, and to reduce the number of data nodes to be used in the test mode and thereby increase the number of simultaneously tested memory devices as described in the second embodiment.

Figure 13:
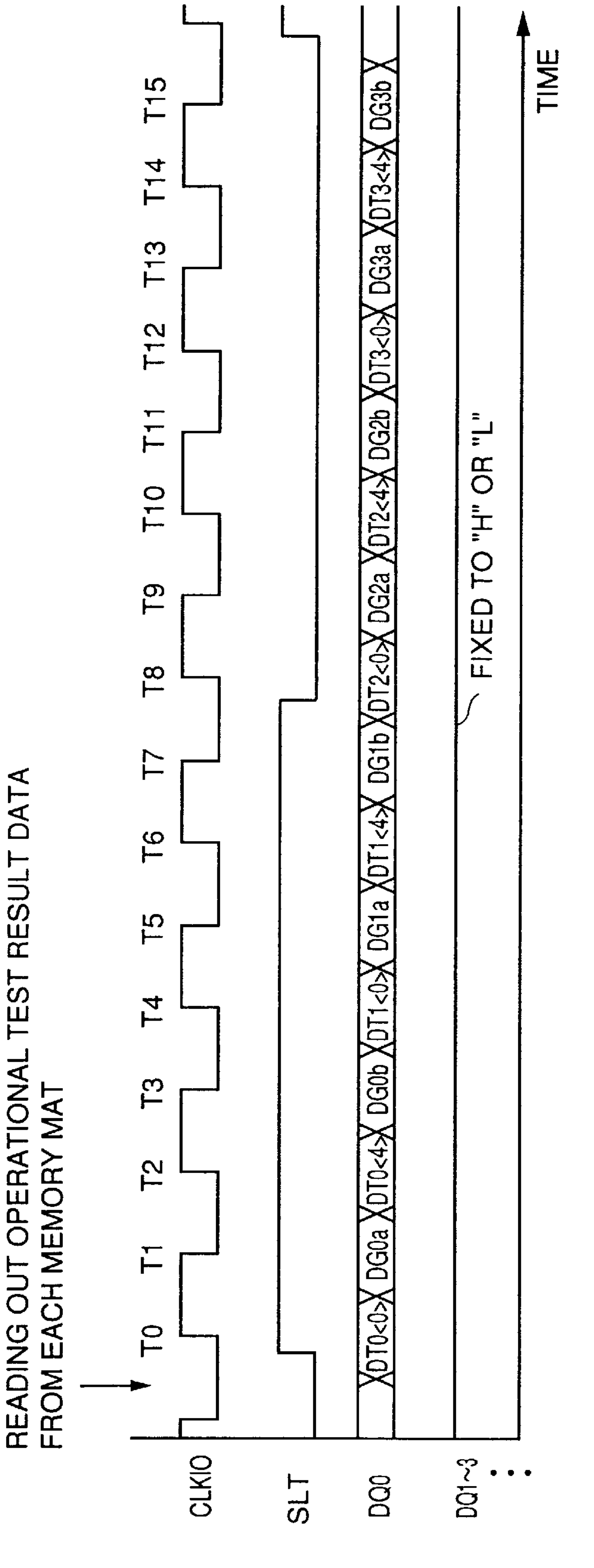
FIG. 13 is a timing chart illustrating data outputting in the test mode of test mode control circuit 230.

FIG. 13 shows a timing chart illustrating data outputting in the test mode of test mode control circuit 230.

Referring to FIG. 13, prior to time T0 corresponding to an activation edge of data input/output control clock CLKIO, data indicating operational test results are read out in parallel from the memory mats, and four compression determination signals and four pieces of uncompressed data are transmitted to the internal nodes.

According to time T0 to T8 corresponding to clock edges of data input/output control clock CLKIO, data node Nd0 outputs as data DQ0 uncompressed data DT0<0>, compression determination signal DG0*a*, uncompressed data DT0<4>, compression determination signal DG0*b*, uncompressed data DT1<0>, compression determination signal DG1*a*, uncompressed data DT1<4>and compression determination signal DG1*b* one by one in series, which correspond to memory mats MT0 and MT1 and are transmitted to internal node N0.

Prior to a clock activation edge at time T8, the signal level of control signal SLT is inverted. In response, uncompressed data and compression determination signals corresponding to memory mats MT2 and MT3 and transmitted to internal node N1 are transmitted to data conversion circuit 50-0. In response to clock edges at time T8 to T15, data node Nd0 output as data DQ0 uncompressed data DT2<0>, compression determination signal DG2*a*, uncompressed data DT2<4>, compression determination signal DG2*b*, uncompressed data DT3<0>, compression determination signal DG3*a*, uncompressed data DT3<4> and compression determination signal DG3*b* one by one in series.

In the above first to fourth embodiments, outputting test data in the test mode has been described. Such a test mode can be applied to a case where clock signal CLK and control signal RQ are input from a low speed tester according to a direct memory access mode and both the memory core portion and the data input/output control portion are tested by the low speed tester, and to a case where data input/output control portion 40 is operated at a frequency higher than memory core portion 20 according to the normal mode.

In the first to fourth embodiments, the unit of data compression in the test mode is equivalent to the unit of replacement and repair. However, this is only illustration of a configuration suitable for efficiently obtaining data on the existence of a defect for repairing employing redundancy. For obtaining desirable analysis data, the data compression unit in the test mode may be different from the replacement and repair unit.

Although the present invention has been described and illustrated in detail, it is clearly understood that the same is by way of illustration and example only and is not to be taken by way of limitation, the spirit and scope of the present invention being limited only by the terms of the appended claims.

What is claim is:

1. A semiconductor memory device, comprising:

a plurality of input/output nodes each inputtingloutputting a signal in series;

a memory core portion for storing a data signal, said memory core portion including a plurality of memory cells arranged in rows and columns, and a plurality of data lines each transmitting said data signal;

a plurality of data conversion circuits arranged between a plurality of internal nodes provided corresponding to said plurality of input/output nodes and said plurality of input/output nodes, said data conversion circuits each receiving M (M is a natural number of at least 2) signals transmitted in parallel from said memory core portion to a corresponding one of said plurality of internal nodes, and transmitting the signals in series to a corresponding one of said plurality of input/output nodes; and a test mode circuit arranged between said plurality of internal nodes and said memory core portion, said test mode circuit including a plurality of data compression circuits each arranged for N (N is a natural number of at least 2) data lines, said data compression circuits each generating K (K is a natural number smaller than N) test result signals according to the N data signals transmitted by said N data lines in a test mode, and said test mode circuit transmitting M signals, at a time, of said test result signals generated by said plurality of data compression circuits in parallel to each of part of the internal nodes of said plurality of internal nodes.

2. The semiconductor memory device according to claim 1, wherein said test result signal includes a compression signal based on the N data signals transmitted by said N data lines.

3. The semiconductor memory device according to claim 2, wherein K is 1, and each of said plurality of data compression circuits has a logic gate for generating as said compression signal an identity comparison result of the N data signals transmitted by said N data lines.

4. The semiconductor memory device according to claim 1, wherein said test result signal includes one of the N data signals transmitted by said N data lines, and a compression signal based on the N data signals transmitted by said N data lines.

5. The semiconductor memory device according to claim 4, wherein K is 2, and each of said plurality of data compression circuits has a logic gate for generating as said compression signal an identity comparison result of the N data signals transmitted by said N data lines.

6. The semiconductor memory device according to claim 1, wherein said test mode circuit further includes a plurality of output selection circuits each arranged for said N data lines between said memory core portion and one of said plurality of internal nodes, each of said output selection circuits transmits the N data signals transmitted by said N data lines to a corresponding one of said internal nodes in a normal reading operation, each of part of said plurality of output selection circuits corresponding to said part of the internal nodes of said plurality of internal nodes transmits said test result signals output from said plurality of data compression circuits to a corresponding one of said internal nodes in said test mode, and each of remaining ones of said plurality of output selection circuits transmits a prescribed fixed potential level to a corresponding one of said internal nodes in said test mode.

7. The semiconductor memory device according to claim 1, wherein said memory core portion further includes a spare array portion for replacing and repairing a defective one of said memory cells, said spare array portion includes a plurality of replacement units each serving as a unit for which said replacing and repairing are performed, and said N is determined according to said replacement unit.

8. The semiconductor memory device according to claim 1, further comprising:

a test control circuit for generating a plurality of control signals based on one frequency in said test mode, wherein said memory core portion and said data conversion circuit operate in response to said plurality of control signals in said test mode.

9. The semiconductor memory device according to claim 1, wherein said plurality of internal nodes are divided into a plurality of groups each including L (L is a natural number of at least 2) internal nodes, said test mode circuit further includes, for each of said groups, an output switch circuit provided corresponding to one of said L internal nodes, and a plurality of data register circuits provided corresponding to remaining (L−1) internal nodes for holding the M signals transmitted in parallel to a corresponding internal node, and said output switch circuit successively selects one of said L internal nodes and transmits the M parallel signals corresponding to the selected one of said internal nodes to one of said plurality of data conversion circuits.

10. The semiconductor memory device according to claim 9, wherein said semiconductor memory device operates in synchronization with a clock signal, and said output switch circuit changes selection of an internal node in a cycle L times as large as a cycle in which one of said plurality of data conversion circuits transmits a signal in series to a corresponding one of said plurality of input/output nodes.

11. The semiconductor memory device according to claim 9, wherein said test result signal includes a compression signal based on the N data signals transmitted by said N data lines.

12. The semiconductor memory device according to claim 11, wherein K is 1, and each of said plurality of data compression circuits has a logic gate for generating as said compression signal an identity comparison result of the N data signals transmitted by said N data lines.

13. The semiconductor memory device according to claim 9, wherein said test result signal includes one of the N data signals transmitted by said N data lines, and a compression signal based on the N data signals transmitted by said N data lines.

14. The semiconductor memory device according to claim 13, wherein K is 2, and each of said plurality of data compression circuits has a logic gate for generating as said compression signal an identity comparison result of the N data signals transmitted by said N data lines.

* * * * *